US007397252B2

(12) United States Patent
Zhou et al.

(10) Patent No.: US 7,397,252 B2
(45) Date of Patent: Jul. 8, 2008

(54) MEASUREMENT OF CRITICAL DIMENSION AND QUANTIFICATION OF ELECTRON BEAM SIZE AT REAL TIME USING ELECTRON BEAM INDUCED CURRENT

(75) Inventors: Lin Zhou, LaGrangeville, NY (US); Eric P. Solecky, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 11/461,068

(22) Filed: Jul. 31, 2006

(65) Prior Publication Data

US 2008/0067373 A1 Mar. 20, 2008

(51) Int. Cl.

| | |
|---|---|
| ***G01R 27/00*** | (2006.01) |
| ***F41G 1/38*** | (2006.01) |
| ***G01N 23/00*** | (2006.01) |
| ***G01J 5/00*** | (2006.01) |
| ***G01B 11/28*** | (2006.01) |
| ***G01B 11/06*** | (2006.01) |
| ***G01B 11/02*** | (2006.01) |

(52) U.S. Cl. ......................... 324/600; 33/297; 250/306; 250/526; 356/628; 356/634; 356/635

(58) Field of Classification Search ................. 324/600; 33/297; 250/306, 526; 356/628, 634, 635
See application file for complete search history.

(56) References Cited

U.S. PATENT DOCUMENTS

| | | | | |
|---|---|---|---|---|
| 5,404,110 | A * | 4/1995 | Golladay | 324/751 |
| 6,114,695 | A * | 9/2000 | Todokoro et al. | 250/310 |
| 6,559,446 | B1 * | 5/2003 | Choo et al. | 250/310 |
| 2003/0029998 | A1 * | 2/2003 | Matsumoto et al. | 250/307 |
| 2005/0189489 | A1 * | 9/2005 | Moert et al. | 250/307 |

* cited by examiner

*Primary Examiner*—Ha Nguyen
*Assistant Examiner*—Karen M Kusumakar
(74) *Attorney, Agent, or Firm*—Scully, Scott, Murphy & Presser, P.C.; Todd M.C. Li, Esq.

(57) ABSTRACT

A method for accurately measuring feature sizes and quantifying the beam spot size in a CDSEM at real time is provided. The inventive method is based on a scanning microscope and it works on both conductive and non-conductive features. The measurement of conductive feature includes first providing a conductive feature on a surface of a substrate (the substrate maybe an insulator, a semiconductor or a material stack thereof). The conductive feature is then connected to ground and thereafter an electron beam probe raster scans the sample. When the electron beam probe hits the conductive feature the spot will have a negative potential. The potential difference between the spot and the ground will induce an electrical current flow. When the electrical beam is off the conductive feature, there will be no current flow. Therefore, by measuring the current response to the location of the beam spot, the dimension of the conductive feature can be derived.

9 Claims, 1 Drawing Sheet

MEASUREMENT OF CRITICAL DIMENSION AND QUANTIFICATION OF ELECTRON BEAM SIZE AT REAL TIME USING ELECTRON BEAM INDUCED CURRENT

FIELD OF THE INVENTION

The present invention relates to semiconductor device fabrication and more particularly to a technique that is capable of providing accurate feature size measurement and/or quantification of an electron beam size at real time.

BACKGROUND OF THE INVENTION

In the semiconductor industry, accurate measurement of the dimensions of a given feature is critical for process control and yield learning. Primarily, the dimension of a feature is measured using a critical dimension scanning electron micrograph (CDSEM) technique. In some limited applications, the dimension of a feature is determined using a scatterometer. In CDSEM, the probe is an electron beam, while light is used as the probe for a scatterometer.

Despite the different probes used, both techniques rely on reflections of the probes off the features under investigation, or electrons generated during the reflection interaction. The reflection can be modulated by the feature itself as well as many other undesired factors. The most common factors that may complicate the measurement are (i) process induced line edge roughness, (ii) process induced residue, and (iii) electrostatic charging induced by process and electron beam in CDSEM.

In addition, and with the current trend of shrinking lines and spaces, it is becoming a growing challenge to differentiate lines from spaces in CDSEM images. Without being able to reliably identify the lines or spacers, there is a risk of measuring from an undesired location, causing false process feedback and yield issues.

There are many activities in processing trying to address the above-mentioned problems. However, because CDSEM and scatterometer work off reflection interaction, it is not possible to eliminate the above challenges. Additional creativities are urgently needed to ensure that the measurement taken accurately represents the desired feature.

CDSEM beam spot size has traditionally be quantified offline during a calibration process by using gold-carbon samples at various limited CDSEM setup conditions. The data obtained from the calibration is then used as a reference (or look up) table. However, there are many, many variables in a CDSEM which may affect the beam spot size and it is nearly impossible to have a reference table for each and every condition.

In view of the above, there is a continued need for providing a new and improved means for accurately determining the feature size during semiconductor processing. A new and improved means for quantification of the beam spot size of a CDSEM at real time is also desirable.

SUMMARY OF THE INVENTION

The present invention provides a method for accurately measuring feature sizes as well as a method that can be used to quantify the beam spot size in a CDSEM at real time. The inventive method is based on a scanning microscope and it works on both conductive and non-conductive features.

The measurement of conductive feature includes first providing a conductive feature on a surface of a substrate (the substrate may be an insulator, a semiconductor or a material stack thereof). The conductive feature is then connected to ground and thereafter an electron beam probe raster scans the sample. When the electron beam probe hits the conductive feature the spot will have a negative potential. The potential difference between the spot and the ground will induce an electrical current flow. When the electrical beam is off the conductive feature, there will be no current flow. Therefore, by measuring the current response to the location of the bean spot, the dimension of the conductive feature can be derived.

When the size of a non-conductive feature is to be measured, the non-conductive feature (insulating, semiconducting or a combination thereof is formed on a conductive substrate. The same basic procedure as mentioned above is then performed and the non-conductive feature is the area where no current response is observed.

The inventive method eliminates electrostatic charge problem, and in fact and principle it works off the charging effect. In addition, the inventive method will truthfully present the dimension of the desired feature even if residue and rough feature size edges are present. Furthermore, because the instant method solely relies on an electrical signal instead of using optical contrast, lines and spaces can be reliably identified. In those areas, the inventive method is superior to CDSEM and scatterometer.

The beam width at real time can also be measured using the method described above.

BRIEF DESCRIPTION OF THE DRAWINGS

FIG. 2 is for a conductive feature, and FIG. 3 is for a non-conductive feature.

DETAILED DESCRIPTION OF THE INVENTION

The present invention, which provides a technique that is capable of providing accurate feature size measurement and/or quantification of an electron beam size at real time, will now be described in greater detail by referring to the following discussion and drawings that accompany the present application.

Figure 1:
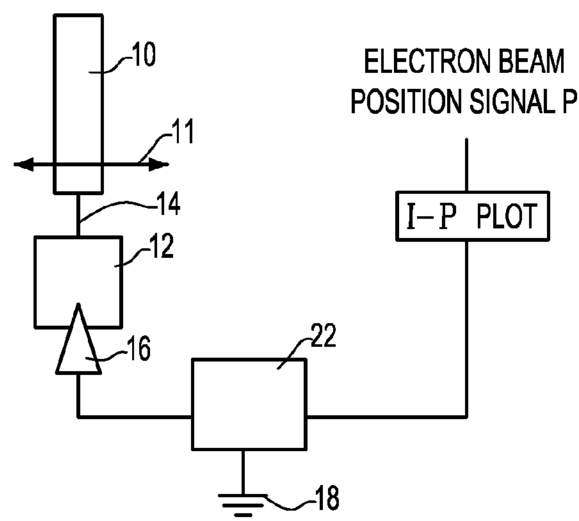
FIG. 1 is a schematic illustrating the basic circuit used in the present invention for measuring the dimension of a feature and/or determining the beam width at real time.

As indicated above, the present invention is based on utilizing a scanning electron microscope to take the measurement using the basic circuit that is shown in FIG. 1. The typically size of the electron beam used in the present invention to take the measurement is from about 1 nm to about 5 nm, with a beam size from about 3 nm to about 4 nm being even more typical. The minimum feature size in today's semiconductor fabrication is about 65nm or less. The beam current that can be utilizing in the present invention can be varied, but typically, the beam current utilized is from about 1 pAmps to about 10 pAmps. Any conventional SEM apparatus can be used in the present invention and, as such, the invention is not limited to any specific SEM apparatus.

Reference is now made to FIG. 1 which illustrates the invention in greater detail. Specifically, FIG. 1 is a schematic showing a feature 10 having a size to be determined by the inventive method. In one embodiment of the present invention, the feature 10 is a conductive feature located on an isolated surface of substrate which can be insulating, semiconducting or multilayers thereof. In another embodiment of the present invention, the feature 10 is a non-conductive feature located on a conductive substrate.

The measurement of conductive feature includes first providing a conductive feature on a surface of a substrate (the substrate maybe an insulator, a semiconductor or a material stack thereof). The conductive feature is then connected to ground and thereafter an electron beam probe raster scans the sample. When the electron beam probe hits the conductive feature the spot will have a negative potential. The potential difference between the spot and the ground will induce an electrical current flow. When the electrical beam is off the conductive feature, there will be no current flow. Therefore, by measuring the current response to the location of the beam spot, the dimension of the conductive feature can be derived.

The feature 10 is formed utilizing standard semiconductor processing including deposition, lithography and etching, which are all well known to those skilled in the semiconductor art. The exact feature size is dependent on the lithographic technique employed as well as the etching method used in forming the same.

It should be noted that although the drawings show a single feature 10, the inventive method is capable of measuring the size of a plurality of features.

In accordance with one embodiment of the present invention, and as illustrated in FIG. 1, the feature 10 is connected to a probe pad 12 via metal wires 14. In another embodiment of the present invention, and when a non-conductive feature is being measured, the probe pad 12 is connected to a conductive substrate which is located beneath the non-conductive feature. For the sake of clarity, the remaining description assumes that a conductive feature is being measured.

The size of the probe pad 12 used in the present invention may vary. Typically, the probe pad 12 has a size from about 50 microns to about 150 microns, with a size from about 100 microns to about 125 microns being even more typical. The probe pad 12 is comprised of any conductive material including, for example, Cu. The probe pad 12 may have any shape including square or rectangular.

The tip of a metallic probe 16 is positioned such that it touches the probe pad 12 and thus makes good ohmic contact. The metallic probe 16 is connected to ground 18 through a high sensitivity signal amplifier 22. While the electron beam is focused into a small probe 11, it raster scans the sample including feature 10. The location of the electron beam 11 at any given time is known to the SEM.

The electron beam induced current I is amplified by the high sensitivity signal amplifier 22 and is constantly monitored. The amplified signal is then fed into a signal analyzer (not specifically shown) along with the signal, which represents the beam location. The signal analyzer employed may be an oscillator, or it may be entirely automated using a computer software program.

Figure 2:
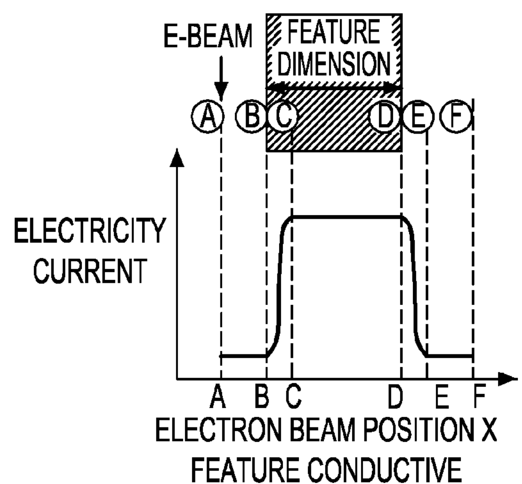
FIGS. 2 and 3 are plots of electrical current vs. probe position for an exemplary feature dimension.

Notwithstanding the type of signal analyzer employed, an XY plot of the induced electrical current (I) vs. electron beam position (P) is generated. An example of an XY plot that can be generated using the method of the present application is shown in FIG. 2. In accordance with the present invention, the interaction between the electron beam and the feature gives rise to an I-P curve in a trapezoidal shape. The X coordinate of each point corresponds to the location of the beam relative to the edge of the feature. In the present invention, the beam spot is approximate to a circular pattern, although it is typically not perfectly circular. The same physical approach is still valid.

In order to determine the beam width at real time utilizing the inventive method, the following equation (which are based on FIG. 2) are used:

Beam spot=XC−XB=XE−XD=the average of the two; the average is used to reduce any background noise from the calculation.

In order to determine the feature size using the inventive method, the following equation is used:

Feature size in the X direction=XD−XB=XE−XC=the average of the two; the average is used to reduce background noise from the calculation.

Figure 3:
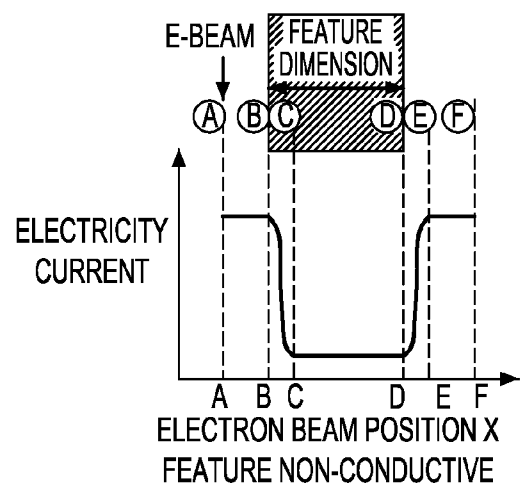

It is again noted that the above-described embodiment is for measuring the feature size of a conductive feature. When a non-conductive feature is to be measured, the probe pad is wired to a conductive substrate that is located beneath the non-conductive feature. An XY plot as shown in FIG. 3 is generated and thereafter the beam spot and the feature size can be calculated. In particular the beam spot at real time is calculated by XC−XB=XE−XD=the average of the two; the average is used to reduce any background noise from the calculation, while the size of the non-conductive feature is calculated by XD−XB=XE−XC=the average of the two; the average is used to reduce background noise from the calculation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of measuring the size of a feature formed on a substrate comprising:

providing at least one feature on a surface of a substrate, wherein said at least one feature or said substrate is a conductive material;

connecting the conductive material to ground;

raster scanning an electron beam across said at least one feature and said substrate, whereby when the electron beam hits the conductive material a negative potential is generated and a potential difference between the conductive material and the ground induces an electrical current flow and when the electrical beam is off the conductive material, no current flow is generated; and measuring the current response to the location of the electron beam and determining the dimension of the conductive material.

2. The method of claim 1 wherein said at least one feature is conductive and said substrate is non-conductive.

3. The method of claim 1 wherein said at least one feature is non-conductive and said substrate is conductive.

4. The method of claim 1 wherein said measuring the current response comprises utilizing a signal analyzer.

5. The method of claim 1 wherein said measuring the current response comprises generating a plot of electrical current vs. probe position.

6. The method of claim 5 wherein said at least one feature is conductive and the dimension of the feature in the X direction is determined using the equation XD−XB=XE−XC=the average of the two, wherein D, B, E and C denote the position of edges of said conductive feature.

7. The method of claim 6 further comprising calculating the beam spot at real time using the equation XC−XB=XE−XD=the average of the two.

8. The method of claim 5 wherein said at least one feature is nonconductive and the dimension in the X direction is determined using the equation XD−XB=XE−XC=the average of the two, wherein D, B, E and C denote edge of said non-conductive feature.

9. The method of claim 8 further comprising calculating the beam spot at real time using the equation XC−XB=XE−XD=the average of the two.

* * * * *